(12) United States Patent
Cheng et al.

(10) Patent No.: US 10,998,441 B2
(45) Date of Patent: May 4, 2021

(54) STRAINED SILICON COMPLEMENTARY METAL OXIDE SEMICONDUCTOR INCLUDING A SILICON CONTAINING TENSILE N-TYPE FIN FIELD EFFECT TRANSISTOR AND SILICON CONTAINING COMPRESSIVE P-TYPE FIN FIELD EFFECT TRANSISTOR FORMED USING A DUAL RELAXED SUBSTRATE

(71) Applicant: INTERNATIONAL BUSINESS MACHINES CORPORATION, Armonk, NY (US)

(72) Inventors: Kangguo Cheng, Schenectady, NY (US); Nicolas J. Loubet, Guilderland, NY (US); Xin Miao, Guilderland, NY (US); Alexander Reznicek, Troy, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 76 days.

(21) Appl. No.: 15/786,037

(22) Filed: Oct. 17, 2017

(65) Prior Publication Data
US 2018/0053853 A1    Feb. 22, 2018

Related U.S. Application Data

(62) Division of application No. 15/178,010, filed on Jun. 9, 2016, now Pat. No. 9,842,929.

(51) Int. Cl.
*H01L 29/78*     (2006.01)
*H01L 27/092*    (2006.01)
*H01L 21/8238*   (2006.01)

(52) U.S. Cl.
CPC .. *H01L 29/7848* (2013.01); *H01L 21/823807* (2013.01); *H01L 21/823821* (2013.01); *H01L 27/0924* (2013.01); *H01L 29/785* (2013.01)

(58) Field of Classification Search
CPC ......... H01L 29/7848; H01L 21/823807; H01L 21/823821; H01L 21/02634; H01L 21/2018–2033
See application file for complete search history.

(56) References Cited

U.S. PATENT DOCUMENTS 7,138,309 B2    11/2006   Lee et al.
7,247,534 B2    7/2007    Chidambarrao et al.
(Continued)

OTHER PUBLICATIONS

Huang et al. "Structural and electronic properties of Si3P4" in Physical Review B vol. 69, p. 054112. Published by the American Physical Society in 2004. (Year: 2004).*
(Continued)

*Primary Examiner* — Tuan A Hoang
(74) *Attorney, Agent, or Firm* — Tutunjian & Bitetto, P.C.; Randall Bluestone

(57) ABSTRACT

A method of forming a semiconductor device that includes forming a strain relaxed buffer (SRB) layer atop a supporting substrate, and epitaxially forming a tensile semiconductor material atop a first portion of the strain relaxed buffer layer (SRB). A second portion of the SRB layer is then removed, and a semiconductor material including a base material of silicon and phosphorus is formed atop a surface of the supporting substrate exposed by removing the second portion of the SRB layer. A compressive semiconductor material is epitaxially forming atop the semiconductor material including the base material of silicon and phosphorus. Compressive FinFET structures can then be formed from the compressive semiconductor material and tensile FinFET
(Continued)

structures can then be formed from the tensile semiconductor material.

18 Claims, 10 Drawing Sheets

(56) References Cited

U.S. PATENT DOCUMENTS

| | | | | |
|---|---|---|---|---|
| 7,888,197 | B2* | 2/2011 | Chidambarrao | H01L 21/84 257/E21.564 |
| 7,968,946 | B2 | 6/2011 | Fischetti et al. | |
| 8,618,556 | B2 | 12/2013 | Wu et al. | |
| 8,963,248 | B2 | 2/2015 | Basker et al. | |
| 9,472,671 | B1* | 10/2016 | Balakrishnan | H01L 27/1203 |
| 2004/0178406 | A1* | 9/2004 | Chu | H01L 21/02381 257/19 |
| 2005/0136584 | A1* | 6/2005 | Boyanov | H01L 29/78 438/199 |
| 2006/0019462 | A1* | 1/2006 | Cheng | H01L 29/739 438/400 |
| 2011/0147811 | A1* | 6/2011 | Kavalieros | H01L 29/66795 257/288 |
| 2014/0106547 | A1 | 4/2014 | Ye et al. | |
| 2014/0151766 | A1* | 6/2014 | Eneman | H01L 29/1054 257/288 |
| 2014/0231872 | A1* | 8/2014 | Colinge | H01L 29/7849 257/192 |
| 2015/0194307 | A1* | 7/2015 | Gaire | H01L 29/66795 257/190 |
| 2015/0214364 | A1* | 7/2015 | Chan | H01L 29/785 257/190 |
| 2015/0311120 | A1 | 10/2015 | Shintri et al. | |
| 2016/0104799 | A1* | 4/2016 | Qi | H01L 29/7849 257/29 |
| 2016/0211261 | A1* | 7/2016 | Liu | H01L 29/267 |
| 2016/0300715 | A1* | 10/2016 | Dube | H01L 21/0262 |
| 2017/0005113 | A1* | 1/2017 | Cheng | H01L 27/1211 |
| 2017/0098692 | A1* | 4/2017 | Chiang | H01L 29/0615 |
| 2017/0141189 | A1* | 5/2017 | Chang | H01L 29/785 |
| 2017/0213912 | A1* | 7/2017 | Lin | H01L 29/7851 |

OTHER PUBLICATIONS

List of IBM Patents or Patent Applications Treated as Related dated Oct. 17, 2017, 2 pages.

* cited by examiner

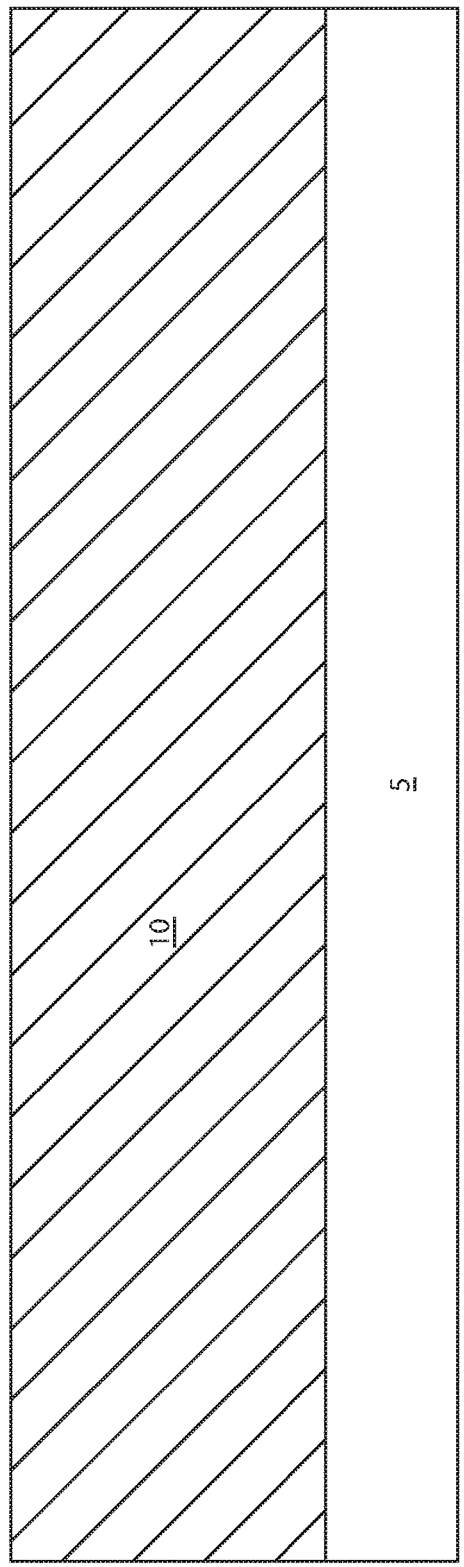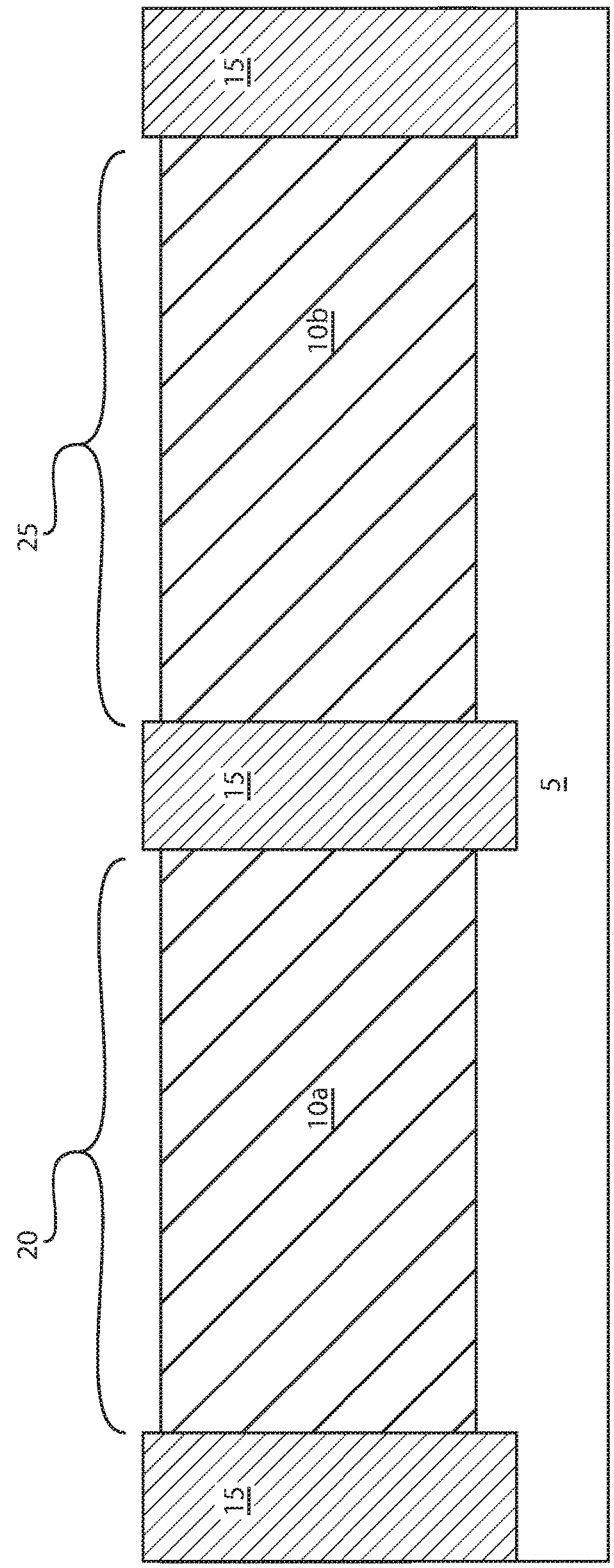

STRAINED SILICON COMPLEMENTARY METAL OXIDE SEMICONDUCTOR INCLUDING A SILICON CONTAINING TENSILE N-TYPE FIN FIELD EFFECT TRANSISTOR AND SILICON CONTAINING COMPRESSIVE P-TYPE FIN FIELD EFFECT TRANSISTOR FORMED USING A DUAL RELAXED SUBSTRATE

BACKGROUND

Technical Field

The present disclosure relates to semiconductor devices, such as semiconductor devices including fin structures.

Description of the Related Art

The dimensions of semiconductor field effect transistors (FETs) have been steadily shrinking over the last thirty years or so, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance improvements. One such class of device is a fin field effect transistor (finFET).

SUMMARY

In one aspect, a method of forming semiconductor devices is provided that employs a high phosphorus concentration silicon containing layer to produce compressive silicon, in which the compressive strain provides for increased carrier speed in p-type semiconductor devices. In one embodiment, the method may include forming a semiconductor material including silicon and phosphorus and epitaxially forming a compressive silicon (Si) containing material on the semiconductor material including the silicon and phosphorus. The method may continue with forming fin structure from the compressive silicon and forming a gate structure on a channel region of the fin structures having the compressive strain. P-type source and drain regions may then be formed on opposing sides of the channel region.

In another embodiment, the method includes forming a strain relaxed buffer (SRB) layer atop a supporting substrate, and epitaxially forming a tensile semiconductor material atop a first portion of the strain relaxed buffer layer (SRB) layer. A second portion of the SRB layer is removed, and a semiconductor material including a base material of silicon and phosphorus is formed atop a surface of the supporting substrate exposed by removing the second portion of the SRB layer. A compressive semiconductor material is epitaxially forming atop the semiconductor material including the base material of silicon and phosphorus. Compressive FinFET structures can then be formed from the compressive semiconductor material and tensile FinFET structures can then be formed from the tensile semiconductor material.

In another aspect of the present disclosure, a semiconductor device is provided including a compressively strained fin structure composed of an epitaxial silicon containing material atop a semiconductor layer composed of silicon and phosphorus. A gate structure is present on a channel portion of the fin structure, and p-type source and drain regions are present on opposing sides of the channel portion of the fin structure. In some embodiments, the semiconductor layer composed of silicon and phosphorus has a base material composition that is silicon phosphide ($Si_3P_4$).

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which:

FIG. 1 is a side cross-sectional view that depicts forming a strain relaxed buffer (SRB) layer on a semiconductor substrate, in accordance with one embodiment of the present disclosure.

FIG. 2 is a side cross-sectional view depicting forming isolation regions to define a first device region for a first conductivity type device and a second device region for a second conductivity type device, in accordance with one embodiment of the present disclosure.

DETAILED DESCRIPTION

Figure 3:
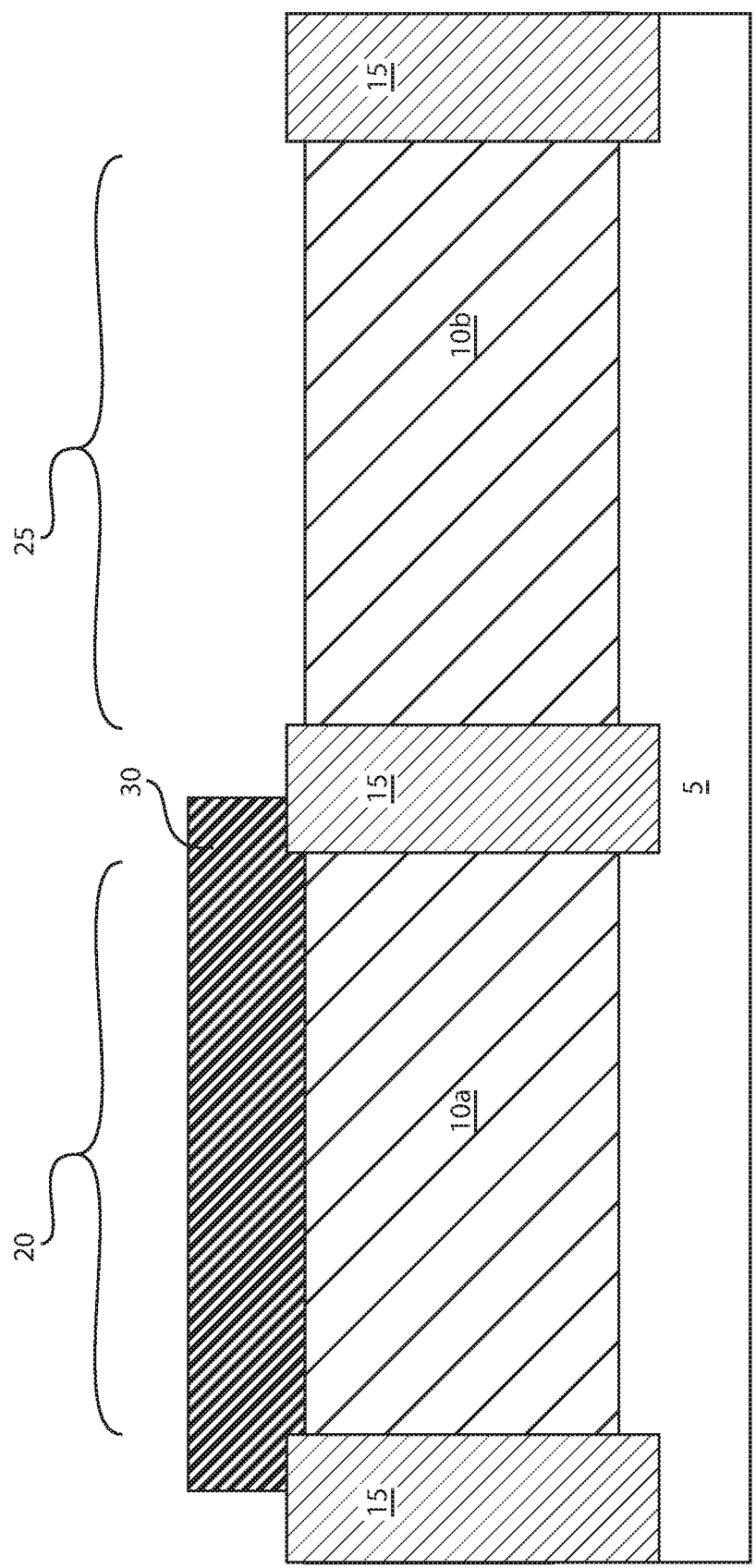
FIG. 3 is a side cross-sectional view depicting one embodiment of a first block mask over the first device region.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. A FinFET is a semiconductor device that positions the channel region of the semiconductor device in a fin structure.

It has been determined that for some scenarios, achieving n-type field effect transistor (nFET) performance targets in future technology nodes may require tensely straining the silicon for the nFET. Strain relaxed substrates can be employed in producing tensely strained structures. Strain relaxed buffers (SRB), otherwise called graded buffer layers (GBL) are one way to produce a relaxed SiGe layer on top of a commonly used silicon wafer. In some embodiments, to meet the performance targets for p-type field effect transistors (pFETs) in complementary metal oxide semiconductor (CMOS) arrangements, the pFET should be compressively strained. One way to product compressively strained silicon for PFETs is by using a silicon germanium (SiGe) alloy which has a higher concentration of germanium (Ge) than the uppermost surface of the SRB layers. But, it has been determined that this approach may not result in a reliable gate stack for the pFET.

The methods and structures disclosed herein provide both nFET and pFET devices including channel regions formed from silicon (Si), which avoid the above noted reliability problems that result from using silicon germanium as a channel material for the pFET device. The methods and structures disclosed herein also lead to easier integration by avoiding a dual channel material solution. As will be described in further detail below, the present disclosure provides tensely strained silicon (Si) for nFET devices epitaxially formed on an SRB layer, while also providing compressively strained silicon (Si) for pFET devices epitaxially formed on a material including silicon and phosphorus, e.g., silicon phosphide $Si_3P_4$, in a CMOS device arrangements. The semiconductor material including silicon and phosphorus used for the epitaxial growth surface for the compressive silicon (Si) has a smaller lattice constant than silicon, leading to compressively strained silicon for the pFET. The methods and structures of the present disclosure are now discussed with more detail referring to FIGS. 1-11.

FIG. 1 depicts a strain relaxed buffer (SRB) layer 10 on a semiconductor substrate 5, i.e., supporting substrate. The semiconductor substrate 5 may be a bulk semiconductor substrate. In some embodiments, the semiconductor substrate 5 may be composed of a type IV semiconductor material or a compound semiconductor material. By "type IV semiconductor" it is meant that the semiconductor material includes at least one element from Group IVA (i.e., Group 14) of the Periodic Table of Elements. Examples of type IV semiconductor materials that are suitable for the fin structure include silicon (Si), germanium (Ge), silicon germanium (SiGe), silicon doped with carbon (Si:C), silicon germanium doped with carbon (SiGe:C) and a combination thereof. Typically, the semiconductor substrate 5 is composed of silicon (Si), e.g., single crystal silicon.

FIG. 1 further depicts a strain relaxed buffer (SRB) layer 10 being present on the semiconductor substrate 5, in which the semiconductor material layer 10 is relaxed. The term "relaxed" denotes a semiconductor material layer that does not have an internal strain, in which the lattice dimension in the direction parallel to the channel plane (x-direction), perpendicular to the channel plane (y-direction) and out of the channel plane (z-direction) are the same. In some embodiments, a strain relaxed buffer (SRB) layer 10 that is substantially relaxed has a strain no greater than about +/−0.1 GPa tensile or compressive. In one example, the strain relaxed buffer (SRB) layer 10 may be completely relaxed.

In one embodiment, the strain relaxed buffer (SRB) layer 10 may be composed of one or multiple layers of silicon germanium (SiGe). In some embodiments, the relaxed semiconductor layer may be composed of silicon germanium (SiGe) having a low germanium content (Ge). For example, the relaxed semiconductor layer 10 may be composed of silicon germanium (SiGe), in which the germanium (Ge) content is 25% or less, or may be composed of a multilayered structure in which the upper surface of the multilayered structure has a germanium (Ge) content of 25% or less. It is noted that the above examples for relaxed semiconductor materials is provided for illustrative purposes only, and the present disclosure is not intended to be limited to only these examples. In one example, the strain relaxed buffer (SRB) layer 10 may be composed of multilayers of silicon (Si), silicon germanium (SiGe), and silicon germanium doped with carbon (SiGe:C). The compositions of the different material layer in the strain relaxed buffer (SRB) layer may be selected in order to relax strain. The thickness for the material layers within the different material layers of the strain relaxed buffer layer may also be selected to relax strain. For example, the thickness of the SRB layer 10 may be on the order of a micron.

It is noted that the above examples are provided for illustrative purposes only, and are not intended to limit the present disclosure, as any semiconductor material may be suitable for the strain relaxed buffer (SRB) layer 10, so long as the material selected has a lattice dimension that can provide a deposition surface for the later formed strained semiconductor materials that provide the active region of the fin structures for producing n-type semiconductor devices having a tensile strain.

In some embodiments, the strain relaxed buffer (SRB) layer 10 may be formed using a deposition process, such as epitaxial deposition. The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial semiconductor material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. The epitaxial deposition process may employ a chemical vapor deposition apparatus, e.g., plasma enhanced chemical vapor deposition (PECVD), metal organic chemical vapor deposition (MOCVD).

FIG. 2 depicting forming isolation regions 15 to define a first device region 20 for a first conductivity type device, e.g., n-type device, and a second device region 25 for a second conductivity type device, e.g., p-type device. The term "conductivity type" as used to described the devices in the first and second device regions 20, 25 mean that the devices formed in these regions have source and drain regions that are doped with a dopant that is either a p-type dopant or an n-type dopant. The isolation regions 16 may be formed by etching a trench through the strain relaxed buffer (SRB) layer 10a, 10b into the substrate 5 utilizing a conventional dry etching process, such as reactive-ion etching (RIE) or plasma etching. The trenches may optionally be lined with a liner material, e.g., an oxide, and then chemical vapor deposition (CVD) or another like deposition process is used to fill the trench with a dielectric material. The dielectric material that is deposited in the trench to form the isolation regions 16 may be an oxide, such as silicon oxide, or a nitride, such as silicon nitride. The isolation regions 16 may optionally be densified after deposition. A planarization process, such as chemical-mechanical polishing (CMP), may optionally be used to provide a planar structure.

FIG. 3 depicts one embodiment of forming a first block mask 30 over the first device region 20. The first block mask 30 may be composed of a material that may be etched selectively to the at least one of the SRB layer 10a, 10b. The term "selective" as used to describe a material removal process denotes that the rate of material removal for a first material is greater than the rate of removal for at least another material of the structure to which the material removal process is being applied. In some embodiments, the first block mask 30 may be a nitride, such as silicon nitride, oxide, such as silicon oxide, or a silicon oxynitride. In yet other examples, the first block mask 30 can be composed of hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, nitrided hafnium silicate (HfSiON), lanthanum oxide ($La_3O_2$), lanthanum aluminate ($LaAlO_3$), zirconium silicate ($ZrSiO_x$) and combinations thereof. It is noted that the above compositions are only examples of dielectric compositions that can be suitable for forming the first block mask 30, and it is not intended that the present disclosure be limited to only those examples.

Referring to FIG. 3, the first block mask 30 may be blanket deposited over the entirety of the first and second device regions 20, 25. The first block mask 30 may be deposited using chemical vapor deposition (CVD), such as plasma enhanced CVD (PECVD) or metal organic chemical vapor deposition (MOCVD). The first block mask 30 may also be formed using chemical solution deposition or physical vapor deposition. The first block mask 30 may have a thickness ranging from 2 nm to 50 nm. In other embodiments, the thickness of the first block mask 30 ranges from 5 nm to 25 nm.

The blanket material layer that has been deposited for the first block mask 30 may be patterned so that the remaining portion only present in the first device region 20. In a first step, a portion of the first block mask 30 may be removed from the second device region 25 to expose the underlying SRB layer 10b, in which a remaining portion of the first block mask 30 is present atop the SRB layer 10a in the first device region 20. In one embodiment, an etch mask, e.g., photoresist mask (not shown), may be formed on a blanket material layer for the first block mask 30 in the first region 20. To provide the photoresist mask, a photoresist layer is first positioned on the blanket material layer for the first block mask 30. The photoresist layer may be provided by a blanket layer of photoresist material that is formed utilizing a deposition process such as, for example, chemical vapor deposition, plasma enhanced chemical vapor deposition, evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer. The developed photoresist mask is present over the first device region 20 of the substrate leaving the second device region 25 of the substrate 5 including the portion of the blanket layer for the first block mask 30 that is to be removed exposed. The exposed portion of the blanket layer for the first block mask 30 may be etched using an etch process that is selective to at least the photoresist mask, wherein the portion of the blanket layer for the first block mask 30 that is protected by the photoresist mask 25 remains in the first device region 20 of the substrate 5.

Figure 4:
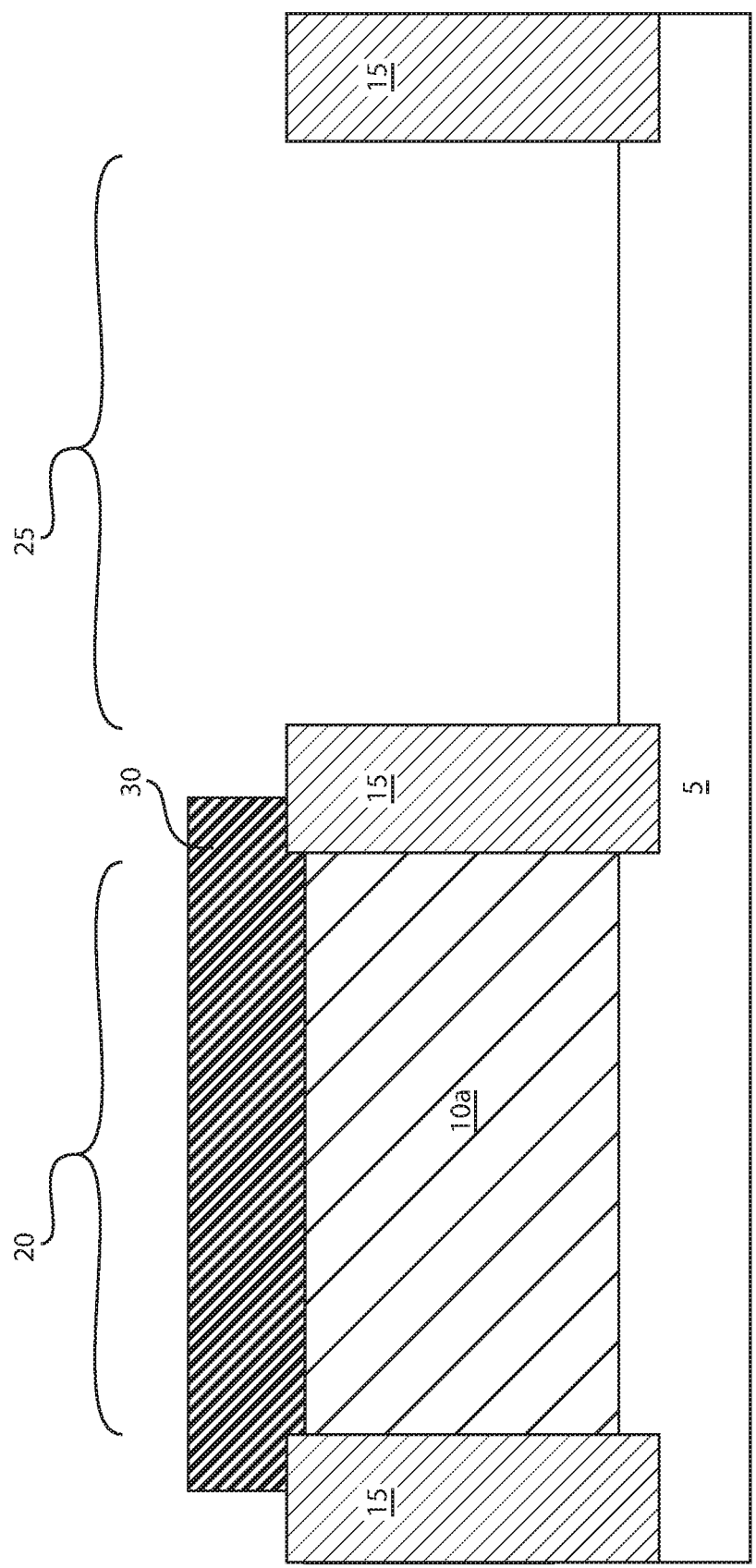
FIG. 4 is a side cross-sectional view depicting one embodiment of an etch process for removing the semiconductor material of the strain relaxed buffer (SRB) layer from the second device region, in which a remaining portion of the semiconductor material of the SRB layer is protected from being removed from the first device region by the first block mask, in accordance with the present disclosure.

FIG. 4 depicts one embodiment of an etch process for removing the semiconductor material of the strain relaxed buffer (SRB) layer 10b from the second device region 25, in which a remaining portion of the semiconductor material of the SRB layer 10a is protected from being removed from the first device region 20 by the first block mask 30. The exposed portion of the SRB layer 10b that is present in the second device region 25 of the substrate 5 may be removed using an etch that is selective to at least one of the first block mask 30 and the semiconductor substrate 5. The etch process for removing the strain relaxed buffer (SRB) layer 10b may include reactive ion etch (RIE), plasma etching, ion beam etching or laser ablation/etching.

Figure 5:
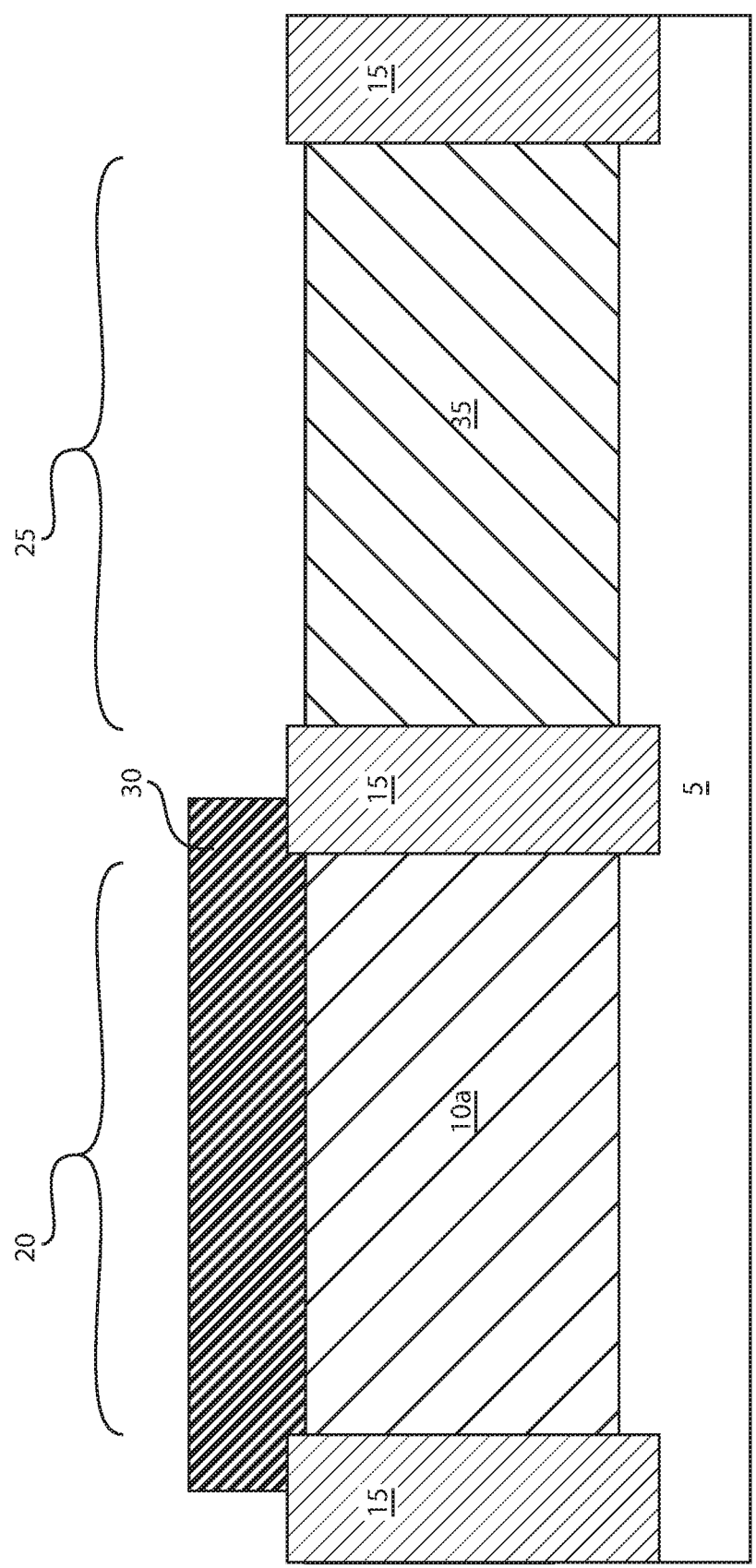
FIG. 5 is a side cross-sectional view depicting one embodiment of epitaxially forming a semiconductor material including a base material of silicon and phosphorus atop the semiconductor substrate in the second device region, in accordance with the present disclosure.

FIG. 5 depicts one embodiment of epitaxially forming a semiconductor material 35 including a base material of silicon and phosphorus on the semiconductor substrate 5 in the second device region 25. The term "base material" denotes the composition of the material without dopants for providing charger carriers, e.g., p-type or n-type dopants for providing electron or hole charge carriers. The semiconductor material 35 is formed of a semiconductor material having a phosphorus content that is selected so that the silicon and phosphorus alloy has a lattice dimension that is less than the lattice dimension of silicon (Si). The lattice dimension may be alternatively referred to as a lattice constant. The lattice constant, or lattice parameter, refers to the physical dimension of unit cells in a crystal lattice. Silicon has a lattice dimension that is equal to 5.431 Å. In some embodiments, the composition of the semiconductor material 35 having a base material composed of silicon and phosphorus is selected to have a lattice dimension equal to 5.4 Å or less. For example, the lattice dimension of the semiconductor material 35 with the base material composed of silicon and phosphorus may range from 4.9 Å to 5.3 Å. In one embodiment, the semiconductor material 35 including silicon and phosphorus comprises a base material of silicon phosphide ($Si_3P_4$). In some embodiments, the lattice dimension of silicon phosphide may range from 4.998 Å to 5.038 Å. In one example, the lattice dimension of silicon phosphide may be equal to 5.027.

The semiconductor material 35 including the base material of silicon and phosphorus is epitaxially grown atop the semiconductor substrate 5, which may be a silicon (Si) monocrystalline substrate. In some embodiments, when the semiconductor material 35 including the base material of silicon and phosphorus is silicon phosphide ($Si_3P_4$), the silicon phosphide ($Si_3P_4$) is epitaxially grown directly on a silicon containing substrate, e.g., a silicon (Si) substrate that is monocrystalline, i.e., single crystal silicon. In some embodiments, silicon phosphide ($Si_3P_4$) is formed when an overabundance of phosphine is flown into the process gas during a fast growing low temperature epitaxial silicon process. The epitaxial silicon process for producing the semiconductor material 35 including the base material of silicon and phosphorus may be conducted in the deposition chamber of a chemical vapor deposition device. Chemical vapor deposition (CVD) is a deposition process in which a deposited species is formed as a result of chemical reaction between gaseous reactants at greater than room temperature (e.g., 250° C. to 900° C.); wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD), Plasma Enhanced CVD (PECVD), Metal-Organic CVD (MOCVD) and combinations thereof may also be employed.

Forming semiconductor material 35 including a base material of silicon and phosphorus typically includes flowing a silicon containing precursor gas and a phosphorus containing precursor gas into the deposition chamber of the chemical vapor deposition (CVD) apparatus containing the deposition surface provided by the exposed upper surface of the semiconductor substrate 5 in the second region 25.

Examples of silicon containing precursors used to form a semiconductor material 35 including a base material of silicon and phosphorus may include), silane ($SiH_4$), dichlorosilane ($Cl_2SiH_2$), trichlorosilane ($Cl_3SiH$), methylsilane (($CH_3)SiH_3$),) disilane ($Si_2H_6$) and combinations thereof. Examples of phosphorus containing precursors may include phosphine ($PH_3$) or silylphosphines.

In one embodiment, the epitaxial deposition process for forming a semiconductor material 35 of silicon phosphide ($Si_3P_4$) includes silane at a pressure ranging from 500 torr to 700 torr, and a temperature ranging from 500° C. to 700° C. with 300 sccm to 400 sccm of 10% phosphine. In one example, the epitaxial deposition process for forming a semiconductor material 35 of silicon phosphide ($Si_3P_4$) includes silane at a pressure of 600 torr and a temperature of approximately 600° C. with 380 sccm of 10% phosphine.

In some embodiments, the semiconductor material 35 including the base material composed of silicon and phosphorus, e.g., silicon phosphide ($Si_3P_4$), is relaxed. In some embodiments, the semiconductor material 35 including the base material composed of silicon and phosphorus, e.g., silicon phosphide ($Si_3P_4$), which is substantially relaxed has a strain no greater than about +/−0.1 GPa tensile or compressive. In one example, the semiconductor material 35 including the base material composed of silicon and phosphorus, e.g., silicon phosphide ($Si_3P_4$), may be completely relaxed. In this example, the combination of the semiconductor material 35 including the base material composed of silicon and phosphorus, e.g., silicon phosphide ($Si_3P_4$), and the remaining portion of the SRB layer 10a provide a dual relaxed substrate that can be used for forming compressive and tensile silicon in p-type and n-type applications for CMOS device arrangements.

In some embodiments, when forming the semiconductor material 35 including a base material composed of silicon and phosphorus, the silicon phosphide ($Si_3P_4$) compound gets incorporated into the silicon (Si) lattice and creates a tensile strain (tensile strain in the overlying silicon (Si)) when compared to the underlying silicon substrate lattice. Most of the phosphorus (P) is chemically bound and not electrically active. For example, for an overall phosphorus concentration of $4 \times 10^{21}$ atoms/$cm^3$ but only about $2 \times 10^{20}$ atoms/$cm^3$ to $3 \times 10^{20}$ atoms/$cm^3$ of the phosphorus is electrical active, in which electrical active phosphorus is not bound in the $Si_3P_4$. Silicon phosphide ($Si_3P_4$) is thermally stable. For example, laser spike annealing (LSA) may take temperatures greater than 1200° C. to relax the strain, but these temperatures can increase the active phosphorus amount, which is an indication of decomposition of the silicon phosphide ($Si_3P_4$) compound.

In some embodiments, the semiconductor material 35 including the base material composed of silicon and phosphorus may be deposited to a thickness ranging from 500 nm to 2.5 micron. In some embodiments, the semiconductor material 35 including the base material composed of silicon and phosphorus may be deposited to a thickness ranging from 750 nm to 1.25 micron. In one example, the semiconductor material 35 including the base material composed of silicon and phosphorus may be deposited to a thickness of 1 micron.

Figure 6:
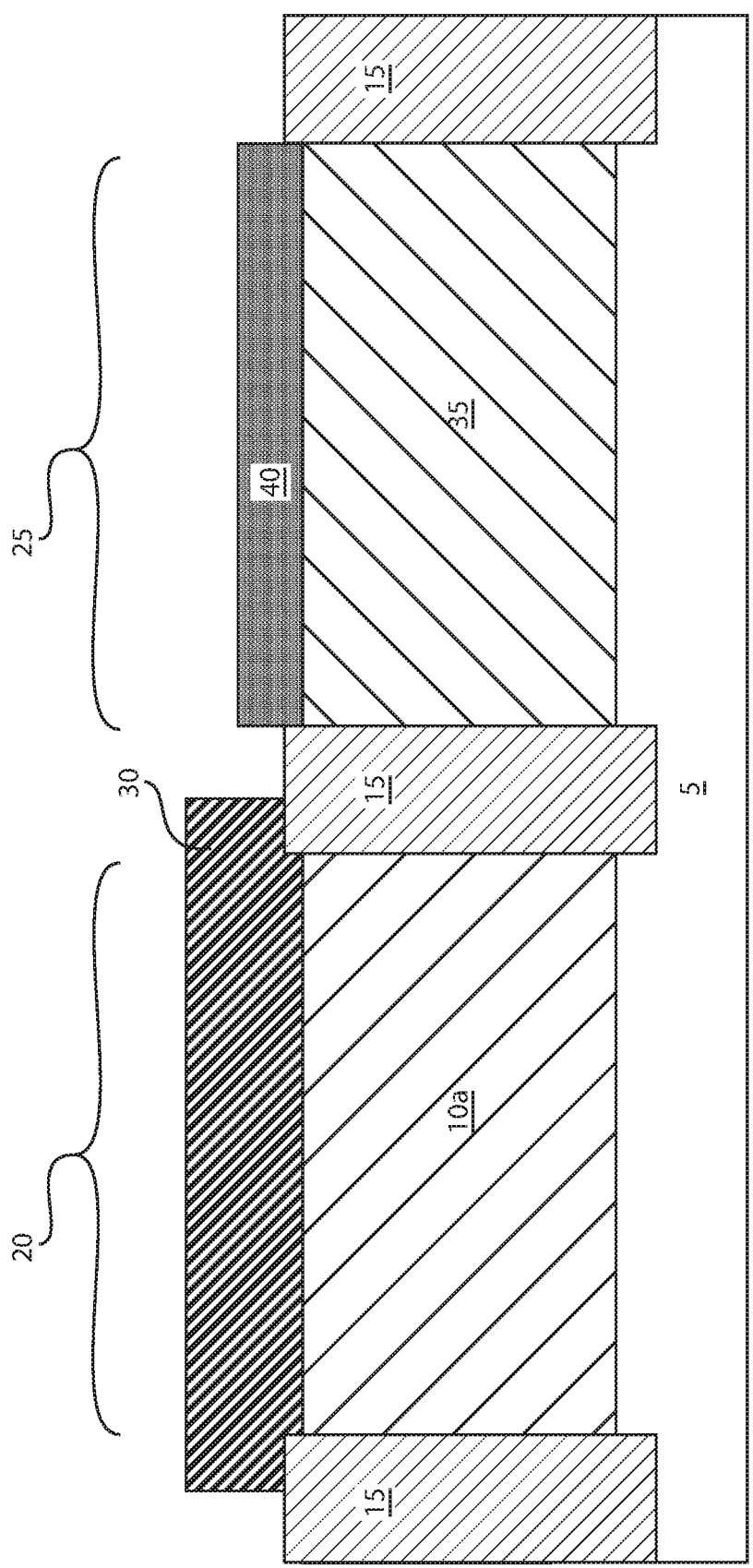
FIG. 6 is a side cross-sectional view depicting one embodiment of epitaxially forming a compressive silicon containing material on the semiconductor material including a base material of silicon and phosphorus.

FIG. 6 depicting one embodiment of epitaxially forming a compressive semiconductor material 40 on the semiconductor material 35 including the base material of silicon and phosphorus. The compressive semiconductor material 40 has a composition that is selected to have a greater lattice dimension than the underlying semiconductor material 35 including a base material composed of silicon and phosphorus. In some embodiments, the lattice dimension of the compressive semiconductor material 40 may be greater than 5 Å. In another embodiment, the lattice dimension of the compressive semiconductor material 40 may be greater than 5.1 Å. In yet other embodiments, the lattice dimension of the compressive semiconductor material 40 may be greater than 5.2 Å. In even further embodiments, the lattice dimension of the compressive semiconductor material 40 may be greater than 5.3 Å. In another embodiment, the lattice dimension of the compressive semiconductor material 40 may be greater than 5.4 Å. It is noted that the lattice dimension of the compressive semiconductor material 40 may be within a range having a lower value and an upper value provided by any of the aforementioned values for the lattice dimension of the compressive semiconductor material 40. In one example, the compressive semiconductor material 40 is silicon (Si), e.g., monocrystalline silicon (Si).

The compressive semiconductor material 40 is epitaxially formed atop the underlying semiconductor material 35 including the base material composed of silicon and phosphorus, in which the difference in lattice dimensions between the two material layers produces a compressive strain. Similar to the underlying semiconductor material 35, the compressive semiconductor material 40 may be formed using a chemical vapor deposition (CVD) apparatus, e.g., Atmospheric Pressure CVD (APCVD), Low Pressure CVD (LPCVD), Plasma Enhanced CVD (PECVD), Metal-Organic CVD (MOCVD) and combinations thereof. Examples of silicon containing precursors used to form the compressive semiconductor material 40 include hexachlorodisilane ($Si_2Cl_6$), tetrachlorosilane ($SiCl_4$), dichlorosilane ($Cl_2SiH_2$), trichlorosilane ($Cl_3SiH$), silane ($SiH_4$), trichlorosilane ($Cl_3SiH$), methylsilane (($CH_3$)$SiH_3$), disilane ($Si_2H_6$) and combinations thereof.

Similar to the method of forming the semiconductor material 35 including the base material composed of silicon and phosphorus, the compressive semiconductor material 40 may be selectively epitaxially formed. For example, the compressive semiconductor material 40 is epitaxially formed on the exposed semiconductor material 35 in the second region 25 of the device, but is not formed on dielectric surfaces, such as the first block mask 30 overlying the remaining portion of the SRB layer 10a in the first region 20 of the device.

The thickness of the compressive semiconductor material 40 is typically selected to provide the height of fin structures for the p-type FinFET semiconductor devices that are ultimately formed in the second region 25 of the device. For example, the thickness of the compressive semiconductor material 40 may range from 5 nm to 200 nm. In another example, the thickness of the compressive semiconductor material 40 may range from 10 nm to 100 nm. The compressive semiconductor material 40 may be composed of substantially defect free monocrystalline silicon. For example, the defect concentration in the compressive semiconductor material 40 may be no greater than 1000 defects/$cm^2$. In another embodiment, the maximum amount of defects formed in the compressive semiconductor material 40 may be no greater than 10 defects/$cm^2$. In one example, the compressive semiconductor material 40 is dislocation defect free.

In one embodiment, the compressive strain in the compressive silicon (Si) containing material ranges from 0.2% to 2%. In another embodiment, the compressive strain in the compressive silicon (Si) containing material may range from 0.5% to 1.5%. In yet another embodiment, the compressive strain in the compressive silicon (Si) containing material may range from 0.7% to 1.2%. The compressive strain produced in the compressive semiconductor material 40 increases carrier transport in p-type semiconductor devices.

Figure 7:
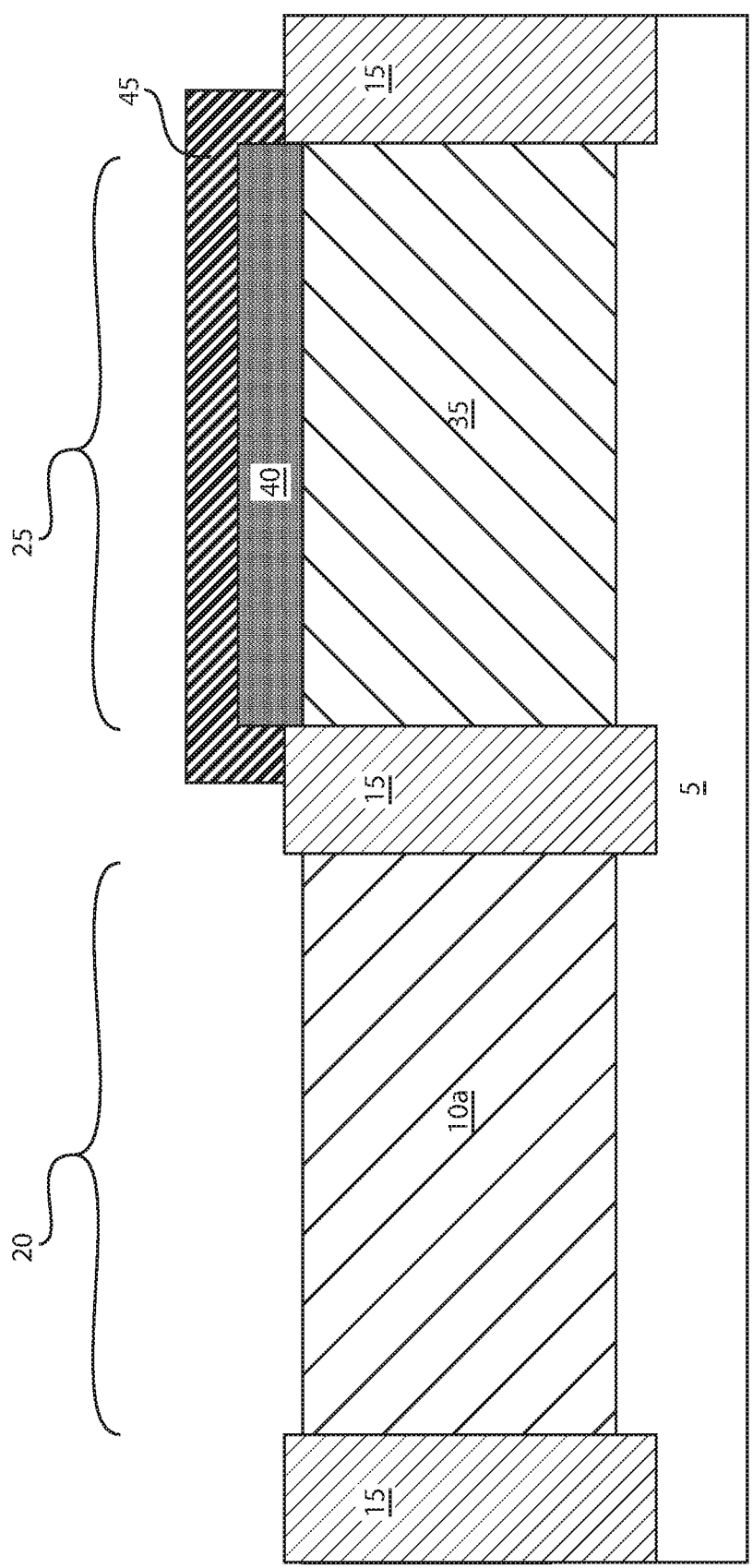
FIG. 7 is a side cross-sectional view depicting forming a second block mask over the compressive silicon containing material that is in the second region of the device, in accordance with one embodiment of the present disclosure.

FIG. 7 depicts one embodiment of forming a second block mask 45 over the compressive semiconductor material 40 that is in the second region 25 of the device. In some embodiments, forming the second block mask 45 may begin with removing the first block mask 30 from the first device region 20. The first block mask 30 may be removed by a selective etch. Following removing the first block mask 30, the second block mask 45 may be formed entirely over the compressive semiconductor material 40 that is present in the second device region 25 using deposition, photolithography and etching processes. The second block mask 45 leaves the first device region 20 including the remaining portion of the SRB layer 10a exposed therein exposed. The second block mask 45 may be a hard mask similar to the first block mask 30 that is described above with reference to FIG. 3. Therefore, the above description of the composition and method of forming the first block mask 30 that is depicted in FIG. 3 can be suitable for describing some embodiments on second block mask 45 that is depicted in FIG. 7. For example, the second block mask 45 may be an oxide, such as silicon oxide, or a nitride such as silicon nitride.

Figure 8:
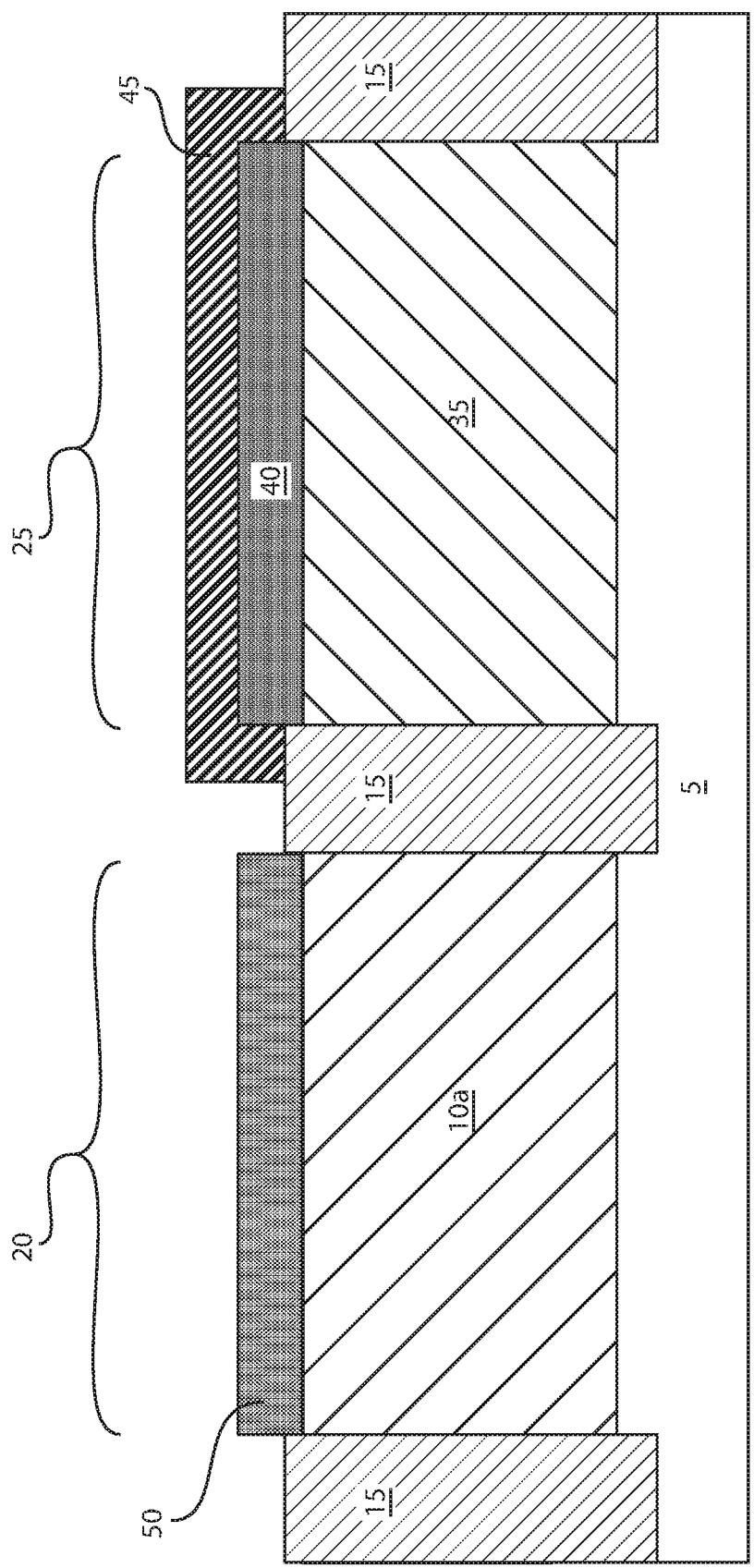
FIG. 8 is a side cross-sectional view depicting epitaxially forming a tensile silicon containing material on the SRB layer, in accordance with one embodiment of the present disclosure.

FIG. 8 depicts one embodiment of epitaxially forming a tensile semiconductor containing material 50 on the exposed remaining portion of the SRB layer 10a. Typically, to provide the tensile strain in the tensile semiconductor material 50, a material composition is selected to have a lesser lattice dimension than the underlying SRB layer 10a. In some embodiments, when the SRB layer 10a is composed of silicon germanium (SiGe), the upper surface of the SRB layer 10a may have a lattice constant ranging from 5.4825 Å to 5.5966 Å. In one example, when the upper surface of the tensile semiconductor containing material 50 is silicon germanium (SiGe) including approximately 25% germanium (Ge), the lattice constant for the material may be substantially equal to 5.4825 Å.

The tensile semiconductor material 50 has a composition that provides a lattice dimension less than the SRB layer 10a. For example, if the SRB layer 10a is composed of silicon germanium (SiGe), the tensile semiconductor material 50 may be composed of silicon (Si), e.g., monocrystalline silicon (Si). Silicon (Si) has a crystal lattice that is equal to 5.431 Å. It is noted that silicon (Si) is not the only material that is suitable for the tensile semiconductor material 50. Other compositions may also be provided so long as the lattice dimension of the tensile semiconductor layer 50 is less than the SRB layer 10a. In some embodiments, the lattice dimension of the tensile semiconductor material 50 may be less than 5.5 Å. In another embodiment, the lattice dimension of the tensile semiconductor material 50 may be less than 5.4 Å. In yet other embodiments, the lattice dimension of the tensile semiconductor material 50 may be less than 5.3 Å. In even further embodiments, the lattice dimension of the tensile semiconductor material 50 may be less than 5.2 Å. In another embodiment, the lattice dimension of the tensile semiconductor material 50 may be less than 5.1 Å. It is noted that the lattice dimension of the tensile semiconductor material 50 may be within a range having a lower value and an upper value provided by any of the aforementioned values for the lattice dimension of the tensile semiconductor material 50.

The tensile semiconductor material 50 is epitaxially formed atop the underlying SRB layer 10a, in which the difference in lattice dimensions between the two material layers produces a tensile strain. The tensile semiconductor material 50 may be formed using a chemical vapor deposition (CVD) apparatus, e.g., Atmospheric Pressure CVD (APCVD), Low Pressure CVD (LPCVD), Plasma Enhanced CVD (PECVD), Metal-Organic CVD (MOCVD) and combinations thereof. Examples of silicon containing precursors used to form tensile semiconductor material 50 include hexachlorodisilane ($Si_2Cl_6$), tetrachlorosilane ($SiCl_4$), dichlorosilane ($Cl_2SiH_2$), trichlorosilane ($Cl_3SiH$), silane ($SiH_4$), trichlorosilane ($Cl_3SiH$), methylsilane (($CH_3$)$SiH_3$), disilane ($Si_2H_6$) and combinations thereof.

Similar to the method of forming the compressive semiconductor material 40, the tensile semiconductor material 50 may be selectively epitaxially formed. For example, the tensile semiconductor material 50 is epitaxially formed on the exposed SRB layer 10*a* in the first region 20 of the device, but is not formed on dielectric surfaces, such as the second block mask 45 overlying the compressive semiconductor material 40 in the second region 25 of the device.

The thickness of the tensile semiconductor material 50 is typically selected to provide the height of fin structures for the n-type FinFET semiconductor devices that are ultimately formed in the first region 20 of the device. For example, the thickness of the tensile semiconductor material 50 may range from 5 nm to 200 nm. In another example, the thickness of the tensile semiconductor material 50 may range from 10 nm to 100 nm. The tensile semiconductor material 50 may be composed of substantially defect free monocrystalline silicon. For example, the defect concentration in the tensile semiconductor material 50 may be no greater than 1000 defects/cm$^2$. In another embodiment, the maximum amount of defects formed in the tensile semiconductor material 50 may be no greater than 10 defects/cm$^2$. In one example, the tensile semiconductor material 50 is dislocation defect free.

In one embodiment, the tensile strain in the tensile silicon (Si) containing material ranges from 0.2% to 2%. In another embodiment, the tensile strain in the compressive silicon (Si) containing material may range from 0.5% to 1.5%. In yet another embodiment, the tensile strain in the compressive silicon (Si) containing material may range from 0.7% to 1.2%. The tensile strain produced in the tensile semiconductor material 50 increases carrier speed in n-type semiconductor devices.

Figure 9:
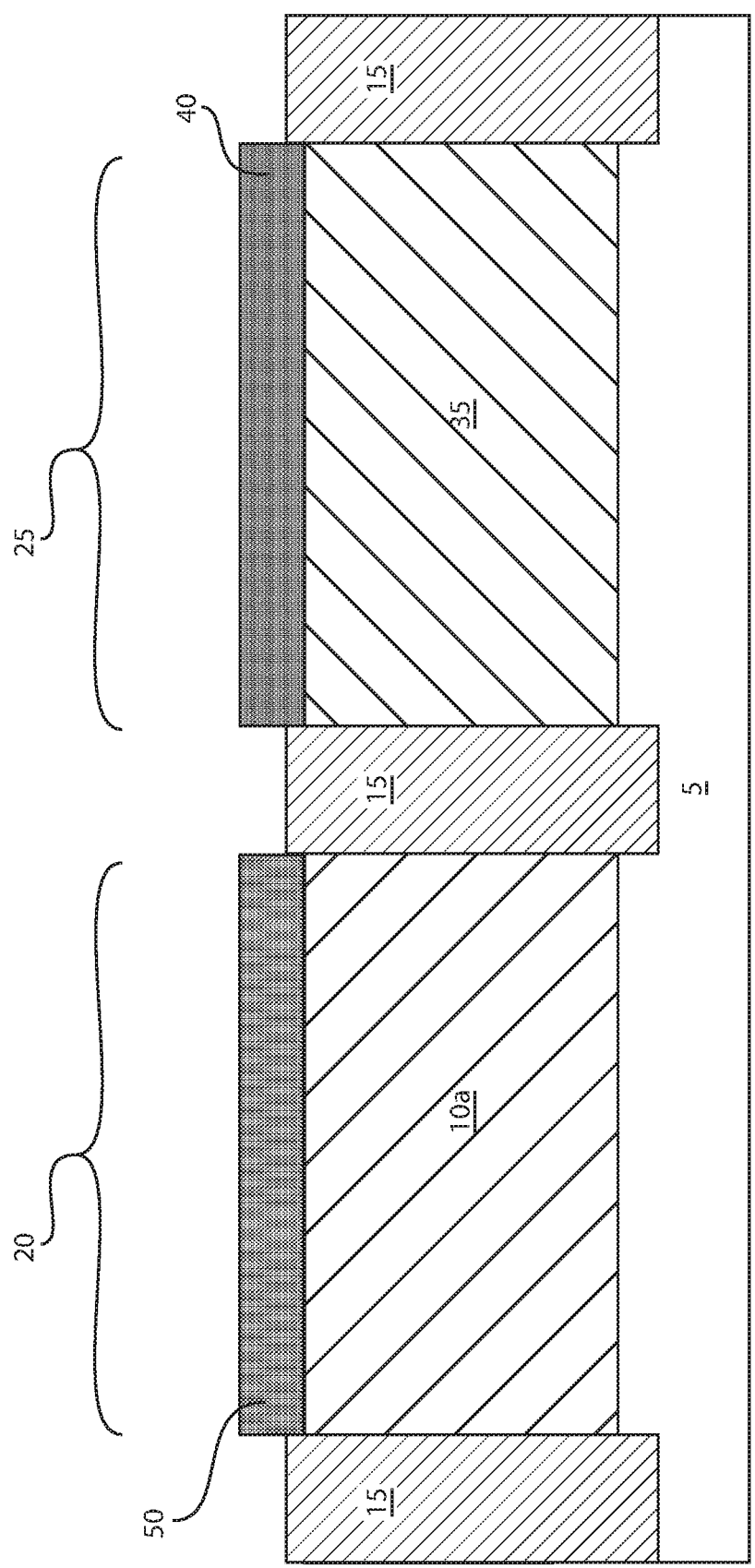
FIG. 9 is a side cross-sectional view depicting removing the second block mask.

Following formation of the tensile semiconductor material 50, the second block mask 45 may be removed to expose the upper surface of the compressive semiconductor material 40 that is depicted in FIG. 9. The second block mask 45 may be removed by a selective etch process.

Figure 10:
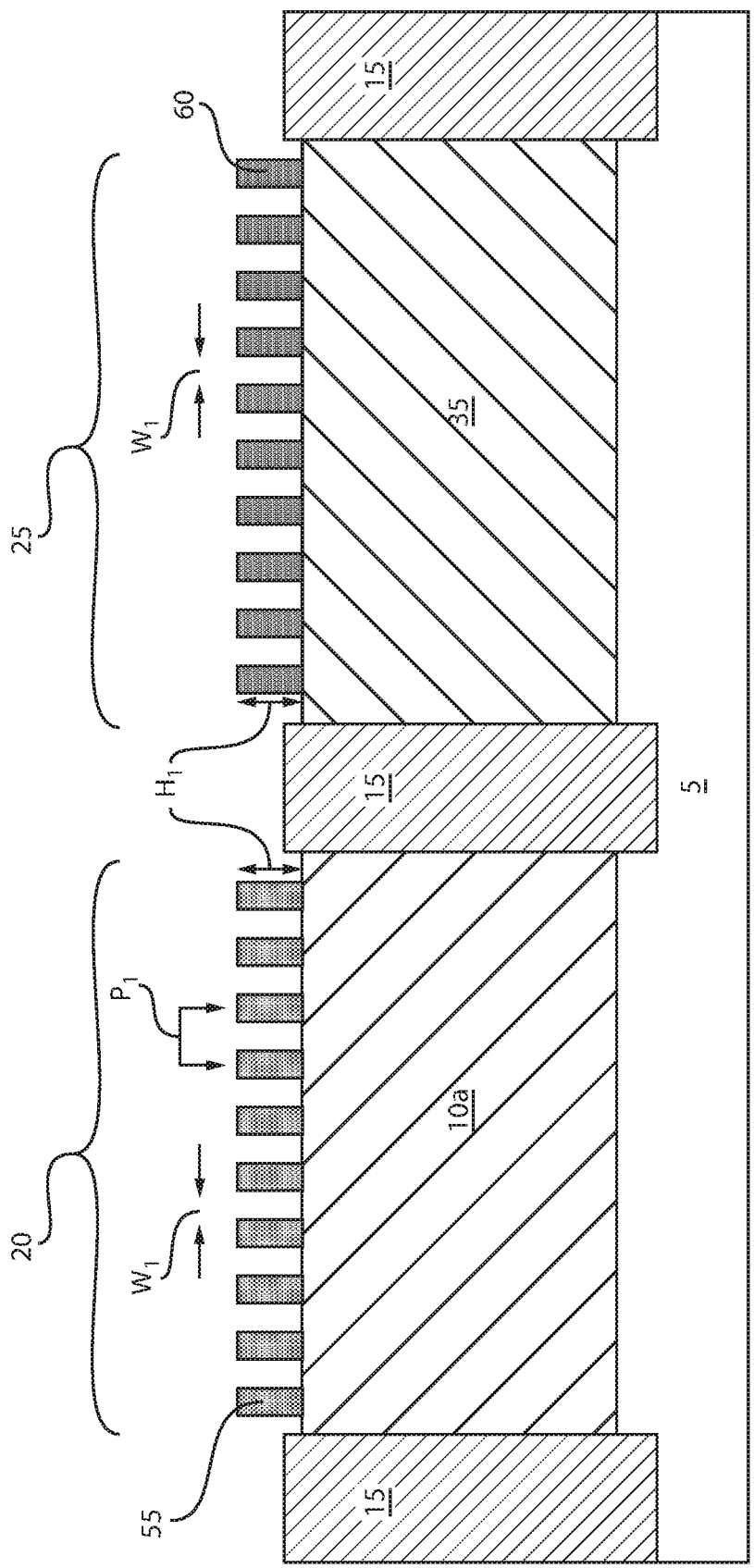
FIG. 10 is a side cross-sectional view depicting one embodiment of patterning the tensile silicon containing material to provide tensile strained fin structures, and patterning the compressive silicon containing material to provide compressive strained fin structures, in accordance with the present disclosure.

FIG. 10 depicts one embodiment of patterning the tensile semiconductor material 50 to provide tensile strained fin structures 55, and patterning the compressive silicon containing material 40 to provide compressive strained fin structures 60. The fin structures 55, 60 may be formed using photolithography and etch processes. In one embodiment, the patterning process used to define each of the fin structures 55, 60 is a sidewall image transfer (SIT) process. The SIT process can include forming a mandrel material layer (not shown) on the material layer that provides the fin structures 55, 60, such as the tensile semiconductor material 50 and the compressive semiconductor material 40. The mandrel material layer can include any material (semiconductor, dielectric or conductive) that can be selectively removed from the structure during a subsequently performed etching process. In one embodiment, the mandrel material layer may be composed of amorphous silicon or polysilicon. In another embodiment, the mandrel material layer may be composed of a metal, such as, e.g., aluminum (Al), tungsten (W), or copper (Cu). The mandrel material layer can be formed by a deposition method, such as chemical vapor deposition or plasma enhanced chemical vapor deposition. In one embodiment, the thickness of the mandrel material layer can be from 50 nm to 300 nm. Following deposition of the mandrel material layer, the mandrel material layer can be patterned by lithography and etching to form a plurality of mandrel structures on the topmost surface of the semiconductor containing material that provides the fin structures 55, 60.

In some embodiments, the SIT process may continue by forming a dielectric spacer on each sidewall of each mandrel structure. The dielectric spacer can be formed by deposition of a dielectric spacer material, and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, but are not limited to, chemical vapor deposition (CVD), plasma enhanced chemical vapor deposition (PECVD), or atomic layer deposition (ALD). Examples of etching that be used in providing the dielectric spacers include any etching process such as, e.g., reactive ion etching (RIE). Since the dielectric spacers are used in the SIT process as an etch mask, the width of the each dielectric spacer determines the width of each fin structure 55, 60.

In some embodiments, after formation of the dielectric spacers, the SIT process continues by removing each mandrel structure. Each mandrel structure can be removed by an etching process that is selective for removing the mandrel material as compared to silicon. Following the mandrel structure removal, the SIT process continues by transferring the pattern provided by the dielectric spacers into the semiconductor material layer that provides the fin structures 55, 60, such as the tensile semiconductor material 50 and the compressive semiconductor material 40. The pattern transfer may be achieved by utilizing at least one etching process that can include dry etching, such as reactive ion etching (RIE), plasma etching, ion beam etching or laser ablation, chemical wet etch processes or a combination thereof. In one example, the etch process used to transfer the pattern may include one or more reactive ion etching (RIE) steps. In some embodiments, the etch process may be an etch process including a chemistry that is selective to the SRB layer 10*a* and the semiconductor material 35 composed of silicon and phosphorus, that is underlying each of the tensile semiconductor material 50 and the compressive semiconductor material 40 that are patterned to provide the fin structures 55, 60. The etching steps pattern the semiconductor material layer to provide the fin structures 55, 60. Following etching, i.e., pattern transfer, the SIT process may conclude with removing the dielectric spacers using an etch process or a planarization process.

It is noted that the aforementioned spacer image transfer (SIT) process is only one method of forming the tensile strained fin structures 55 and compressive strained fin structures 60. In another embodiment, each of the fin structures 55, 60 may be formed using a photoresist etch mask.

Still referring to FIG. 10, the etch process may continue until each of the fin structures 55, 60 may have a height $H_1$ ranging from 5 nm to 200 nm. In another embodiment, each of the fin structures 55, 60 has a height $H_1$ ranging from 10 nm to 100 nm. In one example, each of the fin structures 55, 60 has a height $H_1$ ranging from 20 nm to 50 nm. Each of the fin structures 55, 60 may have a width $W_1$ of less than 15 nm. In another embodiment, each of the fin structures 55, 60 has a width $W_1$ ranging from 3 nm to 8 nm. It is noted that any number of fin structures 55, 60 may be employed in accordance with the present disclosure. In some embodiments, the pitch P1, i.e., center to center, distance separating adjacent fin structures in each of the first and second sets of fin structures 55, 60 may range 35 nm to 45 nm. In another example, the pitch P1 separating adjacent fin structures 55, 60 may range from 30 nm to 40 nm.

Figure 11:
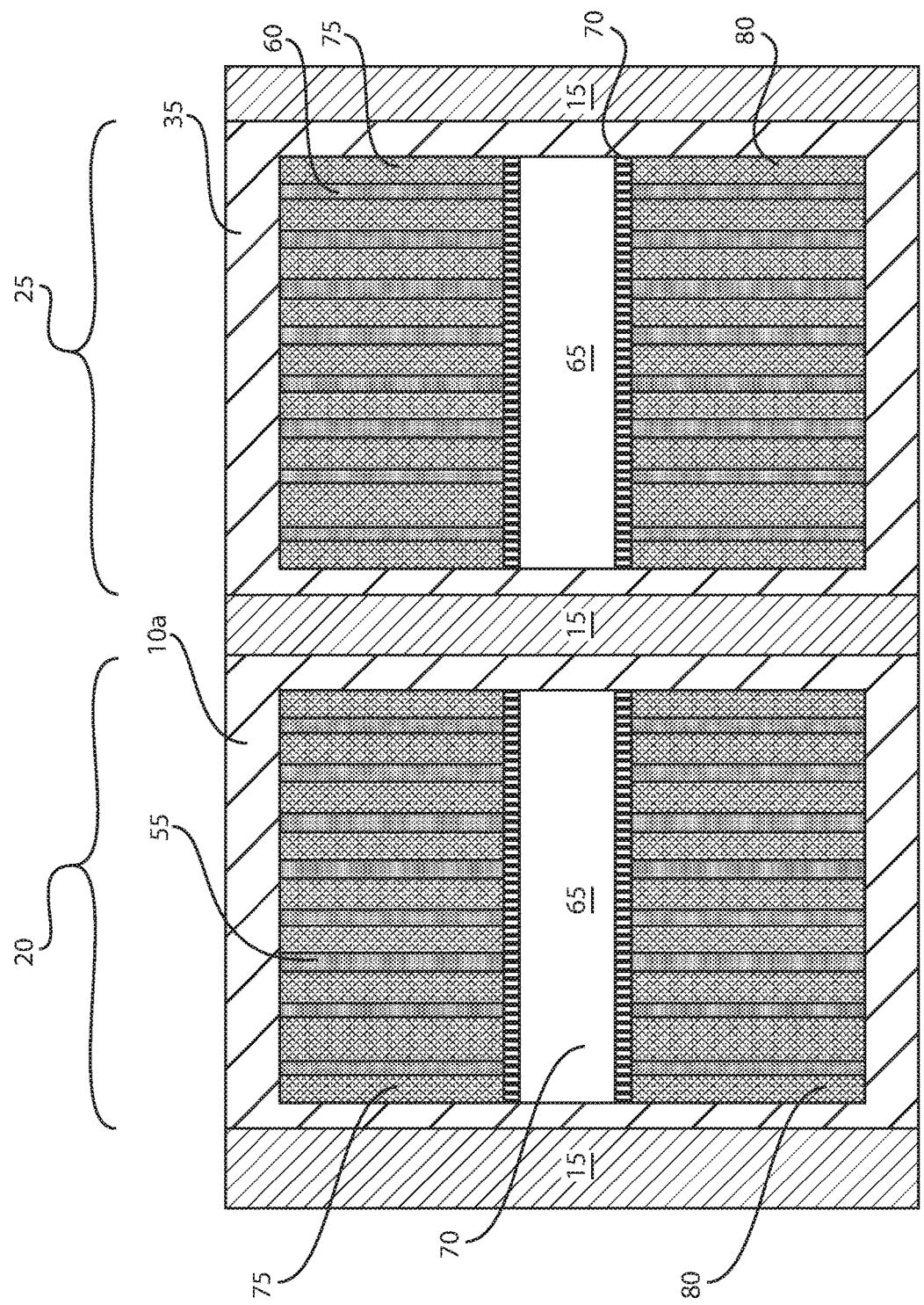
FIG. 11 is a top down view depicting n-type Fin type Field Effect Transistors (n-type FinFETs) formed from the tensile strained fin structures and p-type Fin type Field Effect Transistors (p-type FinFETs) formed from the compressive strained fin structures, in accordance with one embodiment of the present disclosure.

FIG. 11 depicts forming a gate structure 65 on the channel region portion of the fin structures 55, 60. The gate structure 65 typically includes at least a gate dielectric that is present on the channel region the fin structures 55, 60, and a gate electrode that is present on the gate dielectric. In one embodiment, the at least one gate dielectric layer includes, but is not limited to, an oxide, nitride, oxynitride and/or silicates including metal silicates, aluminates, titanates and nitrides. In one example, when the at least one gate dielectric layer is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the at least one gate dielectric layer may vary, but typically, the at least one gate dielectric layer 81 has a thickness from 1 nm to 10 nm. In another embodiment, the at least one gate dielectric layer has a thickness from 1 nm to 3 nm.

The conductive material of the gate electrode may comprise polysilicon, SiGe, a silicide, a metal or a metal-silicon-nitride such as Ta—Si—N. Examples of metals that can be used as the gate electrode include, but are not limited to, Al, W, Cu, and Ti or other like conductive metals. The layer of conductive material for the gate electrode may be doped or undoped. If doped, an in-situ doping deposition process may be employed. Alternatively, a doped conductive material can be formed by deposition, ion implantation and annealing. In yet another embodiment, when the fin structure 60 is being employed in a p-FinFET, the gate electrode may be composed of a p-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. In one embodiment, the p-type work function metal layer may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof.

In yet another embodiment, when the fin structure 55 is being employed in an n-FinFET, the gate electrode may include an n-type work function metal layer. An "n-type work function metal layer" is a metal layer that effectuates an n-type threshold voltage shift. In one embodiment, the work function of the n-type work function metal layer ranges from 4.1 eV to 4.3 eV. In some embodiments, the n-type work function metal layer is composed of at least one of TiAl, TaN, TiN, HfN, HfSi, or combinations thereof.

The gate structure 65 may be formed by using a deposition method, such as a chemical vapor deposition method and/or a physical vapor deposition (PVD), to deposit the material layers for the at least one gate dielectric layer and the at least one gate electrode followed by photolithography and etch processing.

In some embodiments, a gate sidewall spacer 70 can be formed on the sidewall of the gate structure 65, as depicted in FIG. 11. In one embodiment, the gate sidewall spacer 70 may be formed by using a blanket layer deposition process, such as CVD, and an anisotropic etchback method. The gate sidewall spacer 70 may have a width ranging from 2.0 nm to 15.0 nm, and may be composed of a dielectric, such as a nitride, oxide, oxynitride, or a combination thereof.

FIG. 11 further depicts one embodiment of forming source regions 75 and drain regions 80 on the source and drain region portions of the fin structures 55, 60 that are present on opposing sides of the fin structure's channel region. The conductivity type, i.e., whether n-type or p-type, of the source and drain regions typically dictate the conductivity type of the semiconductor device, i.e., whether the semiconductor device is n-type or p-type. As used herein, "p-type" refers to the addition of impurities to an intrinsic semiconductor that creates deficiencies of valence electrons. For example, in a type IV semiconductor material, such as silicon (Si), germanium (Ge) or silicon germanium (SiGe), examples of p-type dopants, i.e., impurities, include but are not limited to: boron, aluminum, gallium and indium. As used herein, "n-type" refers to the addition of impurities that contributes free electrons to an intrinsic semiconductor. For example, in a type IV semiconductor, such as a silicon (Si), germanium (Ge), and silicon germanium (SiGe), examples of n-type dopants, i.e., impurities, include but are not limited to antimony, arsenic and phosphorous. In one embodiment, the source and drain regions 75, 80 in the first device region 20 are doped to an n-type conductivity to provide tensile strained n-type FinFETs, and the source and drain regions 75, 80 in the second device region 25 are doped to a p-type conductivity to provide compressive strained p-type FinFETs.

The source and drain regions 75, 80 typically include an epitaxial semiconductor material that is formed on the source and drain region portions of the fin structures 55, 60. The epitaxial semiconductor material for the source and drain regions 75, 80 may be a type IV s semiconductor, such as silicon (Si), silicon germanium (SiGe), germanium (Ge), silicon doped with carbon (Si:C), or the epitaxial semiconductor material for the source and drain regions 75, 80 may be at type III-V compound semiconductor material, such as gallium arsenide (GaAs). The epitaxial semiconductor material may be doped to the conductivity type of the source and drain region. The dopant may be introduced to the epitaxial semiconductor material using in-situ doping. The term "in-situ" as used to describe the dopant that provides the conductivity type of the source and drain semiconductor material means that the dopant, e.g., p-type dopant, that dictates the conductivity type of the epitaxially formed in situ doped source and drain semiconductor material is introduced during the process step, e.g., epitaxial deposition, which forms the in situ doped source and drain semiconductor material. In some embodiments, extension source and drain regions may be formed in the source and drain region portions of the fin structure 55, 60 by thermally diffusing the dopant from the epitaxial semiconductor material into the active portion of the fin structures 55, 60. In some embodiments, the charge carrier type dopant in said source and drain region 75, 80 is present in a concentration ranging from $1\times10^{20}$ dopants/cm$^3$ to $2\times10^{20}$ dopants/cm$^3$.

It is noted that in the above examples, a gate first process has been described for forming the gate structure 64. The methods and structures of the present disclosure are not limited to only this process flow, as gate last processing is also suitable for use with the present disclosure. A gate last process can include forming a replacement gate structure on the channel portion of the fin structures, forming a spacer on the sidewall of the replacement gate structure, forming source and drain regions on opposing sides of the replacement gate structure, removing the replacement gate structure, and forming a functional gate structure in the space once occupied by the replacement gate structure. The replacement gate structure can include sacrificial material that defines the geometry of a later formed functional gate structure that functions to switch the semiconductor device from an "on" to "off" state, and vice versa. A process sequence employing a replacement gate structure may be referred to as a "gate last" process sequence. Both gate first and gate last process sequences are applicable to the present disclosure.

In another aspect, the present disclosure provides a semiconductor device, e.g., FinFET semiconductor device, that includes a compressively strained fin structure 60 comprised of epitaxial silicon on a semiconductor material layer 35 of silicon and phosphorus, a gate structure 65 on a channel portion of the fin structure 60, and p-type source and drain regions 75, 80 that are present on opposing sides of the channel portion of the fin structure 60. The semiconductor material layer 35 of silicon and phosphorus can have a base material that is silicon phosphide ($Si_3P_4$). The p-type compressively strained semiconductor device, e.g., p-type FinFET, is present in a second device region 25 of the semiconductor device substrate, while an n-type tensile strained semiconductor device, e.g., n-type FinFET is present is a first region 20 of the semiconductor device substrate, in which the first and second device regions 20, 25 are provide by the same substrate structure. The terms "first" and 'second" as used to describe the different regions of the substrate can be used interchangeably. For example, the p-type FinFET can be in a first region, and the n-type FinFET can be in a second region.

The n-type tensile strained FinFET can be composed of epitaxial silicon fin structures 55 on a strain relaxed buffer (SRB) layer 10a composed of silicon and germanium. The tensile strained fin structure may further include a gate structure 65 on a channel region portion of the tensile strained fin structure 60, and n-type source and drain regions 75, 80 on opposing sides of the gate structure 65 that is present on the channel region portion of the tensile strained fin structure 55. In one embodiment, the compressive strain in the compressive strained fin structures 60 ranges from +0.5% to +5%, and the tensile strain in the tensile strained fin structures 55 ranges from −0.5% to −5%.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor device comprising:
    forming a semiconductor material of silicon phosphide having the stoichiometry $Si_3P_4$ that is relaxed using an epitaxial growth process with silicon containing gas precursors and phosphine gas precursor, the phosphine gas precursor being flowed to provide an overabundance of phosphine with a flow rate for the phosphine gas precursor being greater than 300 sccm, wherein a majority of phosphorus content of said semiconductor material is chemically bound and electrically inactive;
    epitaxially forming a compressive silicon (Si) containing material on the semiconductor material including the silicon phosphide ($Si_3P_4$), wherein a compressive strain in said compressive silicon (Si) containing material results from a different in lattice dimension between the silicon phosphide ($Si_3P_4$) and the compressive silicon (Si) containing material;
    forming a fin structure from the compressive silicon (Si) containing material;
    forming a gate structure on a channel region of the fin structure having the compressive strain; and
    forming p-type source and drain regions on opposing sides of the channel region.

2. The method of claim 1, wherein the semiconductor material including silicon phosphide ($Si_3P_4$) is formed directly on a silicon containing substrate.

3. The method of claim 1, wherein the semiconductor material including the silicon phosphide ($Si_3P_4$) has a thickness ranging from 500 nm to 2.5 micron.

4. The method of claim 1, wherein the compressive strain in the compressive silicon (Si) containing material ranges from +0.5% to +2%.

5. The method of claim 1, wherein the semiconductor material including the silicon phosphide ($Si_3P_4$) is formed on a supporting substrate composed of silicon.

6. The method of claim 1, wherein forming the p-type source and drain regions comprises ion implanting a p-type dopant into source and drain region portions of the fin structures, epitaxially growing an in situ doped semiconductor material on the source and drain region portions of the fin structures, or a combination thereof.

7. A method of forming a semiconductor device comprising:
    forming a strain relaxed buffer (SRB) layer of a type IV semiconductor atop a supporting substrate;
    epitaxially forming a tensile semiconductor material atop a first portion of the strain relaxed buffer layer (SRB) layer;
    removing a second portion of the SRB layer;
    forming a semiconductor material having a different composition from the SRB layer and including a base material of silicon phosphide having the stoichiometry $Si_3P_4$ that is relaxed using an epitaxial growth process with silicon containing gas precursors and phosphine gas precursor, the phosphine gas precursor being flowed to provide an overabundance of phosphine with a flow rate for the phosphine gas precursor being greater than 300 sccm, the semiconductor material formed atop a surface of the supporting substrate exposed by removing the second portion of the SRB layer, wherein a majority of phosphorus content of said semiconductor material is chemically bound and electrically inactive;
    epitaxially forming a compressive semiconductor material atop the semiconductor material including the base material of the silicon phosphide ($Si_3P_4$), wherein a compressive strain in said compressive semiconductor material results from a different in lattice dimension between the silicon phosphide ($Si_3P_4$) and the compressive material; and forming compressive FinFET structures from the compressive semiconductor material and tensile FinFET structures from the tensile semiconductor material.

8. The method of claim 7, wherein said forming compressive FinFET structures from the compressive semiconductor material and tensile FinFET structures from the tensile semiconductor material comprises:
    forming compressive fin structures from the compressive semiconductor material and tensile fin structures from the tensile semiconductor material;
    forming gate structures on a channel region of the compressive and tensile fin structures;
    forming n-type source and drain regions on opposing sides of the channel region for the tensile fin structure; and
    forming p-type source and drain regions on the opposing sides of the channel region for the compressive fin structure.

9. The method of claim 7, wherein the strain relaxed buffer (SRB) layer comprises at least one semiconductor layer selected from the group consisting of silicon germanium (SiGe), silicon germanium doped with carbon (SiGe:C) and silicon.

10. The method of claim 9, wherein the strain relaxed buffer (SRB) layer has a thickness ranging from 500 nm to 1.5 micron.

11. The method of claim 9, wherein the tensile semiconductor material is silicon (Si) and the compressive semiconductor material is silicon (Si).

12. The method of claim 11, wherein a compressive strain in the compressive semiconductor material ranges from +0.5% to +2%, and a tensile strain in the tensile semiconductor material ranges from −0.5% to −2%.

13. A method of forming a semiconductor device comprising:
    forming a semiconductor material of silicon phosphide having the stoichiometry $Si_3P_4$ that is relaxed using an epitaxial growth process with silicon containing gas precursors and phosphine gas precursor, the phosphine gas precursor being flowed to provide an overabundance of phosphine with a flow rate for the phosphine gas precursor being greater than 300 sccm, wherein a majority of phosphorus content of said semiconductor material is chemically bound and electrically inactive;
    epitaxially forming a compressive silicon (Si) containing material on the semiconductor material of silicon phosphide ($Si_3P_4$), wherein a compressive strain in said compressive silicon (Si) containing material results from a different in lattice dimension between the silicon phosphide ($Si_3P_4$) and the compressive silicon (Si) containing material;
    forming a fin structure from the compressive silicon (Si) containing material; and
    forming p-type source and drain regions on opposing sides of a channel region of the fin structure.

14. The method of claim 13, wherein the semiconductor material of silicon phosphide ($Si_3P_4$) is formed directly on a silicon containing substrate.

15. The method of claim 13, wherein the semiconductor material of silicon phosphide ($Si_3P_4$) has a thickness ranging from 500 nm to 2.5 micron.

16. The method of claim 13, wherein the compressive strain in the compressive silicon (Si) containing material ranges from +0.5% to +2%.

17. The method of claim 13, wherein the semiconductor material of silicon phosphide ($Si_3P_4$) is formed on a supporting substrate composed of silicon.

18. The method of claim 13, wherein forming the p-type source and drain regions comprises ion implanting a p-type dopant into source and drain region portions of the fin structures, epitaxially growing an in situ doped semiconductor material on the source and drain region portions of the fin structures, or a combination thereof.

* * * * *